United States Patent
Mabuchi et al.

(10) Patent No.: US 9,749,569 B2
(45) Date of Patent: Aug. 29, 2017

(54) HIGH SPEED ROLLING IMAGE SENSOR WITH ADM ARCHITECTURE AND METHOD OF IMPLEMENTING THEREOF

(71) Applicant: OMNIVISION TECHNOLOGIES, INC., Santa Clara, CA (US)

(72) Inventors: Keiji Mabuchi, Los Altos, CA (US); Sohei Manabe, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 30 days.

(21) Appl. No.: 14/979,058

(22) Filed: Dec. 22, 2015

(65) Prior Publication Data

US 2017/0180663 A1   Jun. 22, 2017

(51) Int. Cl.
| | |
|---|---|
| H04N 5/3745 | (2011.01) |
| H01L 27/146 | (2006.01) |
| H04N 5/345 | (2011.01) |
| H04N 5/378 | (2011.01) |
| H04N 5/374 | (2011.01) |
| H04N 5/353 | (2011.01) |

(52) U.S. Cl.
CPC ... H04N 5/37455 (2013.01); H01L 27/14634 (2013.01); H04N 5/345 (2013.01); H04N 5/3532 (2013.01); H04N 5/374 (2013.01); H04N 5/378 (2013.01)

(58) Field of Classification Search
CPC .... H04N 5/37455; H04N 5/345; H04N 5/378; H04N 5/374; H04N 5/3532; H01L 27/14634
See application file for complete search history.

(56) References Cited

U.S. PATENT DOCUMENTS

| | | | | |
|---|---|---|---|---|
| 8,773,562 | B1 * | 7/2014 | Fan | H01L 27/14643 250/208.1 |
| 9,013,615 | B2 * | 4/2015 | Kirsch | H04N 5/341 348/222.1 |
| 2004/0034457 | A1 * | 2/2004 | Stam | B60Q 1/1423 701/36 |
| 2010/0276572 | A1 * | 11/2010 | Iwabuchi | H04N 5/2253 250/208.1 |

(Continued)

*Primary Examiner* — Shahbaz Nazrul
(74) *Attorney, Agent, or Firm* — Christensen O'Connor; Johnson Kindness PLLC

(57) ABSTRACT

High speed rolling image sensor includes pixel array disposed in first semiconductor die, readout circuits disposed in second semiconductor die and conductors. Pixel array is partitioned into pixel sub-arrays (PSAs). Each of the PSAs includes a plurality of pixels. Pixel groups include pixels that are non-contiguous, non-overlapping and distinct. Each pixel group includes pixels from different PSAs. Each pixel group is coupled to a corresponding analog-to-digital converter and memory unit tiles (ADMs) respectively included in readout circuits. ADMs respectively include (i) analog-to-digital (ADC) circuits that convert the image data from pixel groups from analog to digital to obtain ADC outputs, and (ii) memory units to store ADC outputs. Conductors are coupling pixel array to ADMs. Conductors include number of conductors per column of pixel array. Number of conductors per column of pixel array may be equal to number of pixels in PSA arranged in same column. Other embodiments are described.

19 Claims, 8 Drawing Sheets

(56) References Cited

U.S. PATENT DOCUMENTS

| | | | |
|---|---|---|---|
| 2013/0293753 A1* | 11/2013 | Keelan | H04N 5/3745 |
| | | | 348/302 |
| 2013/0308027 A1* | 11/2013 | Jenkin | H04N 5/347 |
| | | | 348/302 |
| 2015/0288908 A1 | 10/2015 | Shen | |
| 2016/0178749 A1* | 6/2016 | Lin | H04N 5/378 |
| | | | 348/302 |
| 2016/0330392 A1* | 11/2016 | Solhusvik | H04N 5/37457 |
| 2017/0077168 A1* | 3/2017 | Wan | H01L 27/14652 |

\* cited by examiner

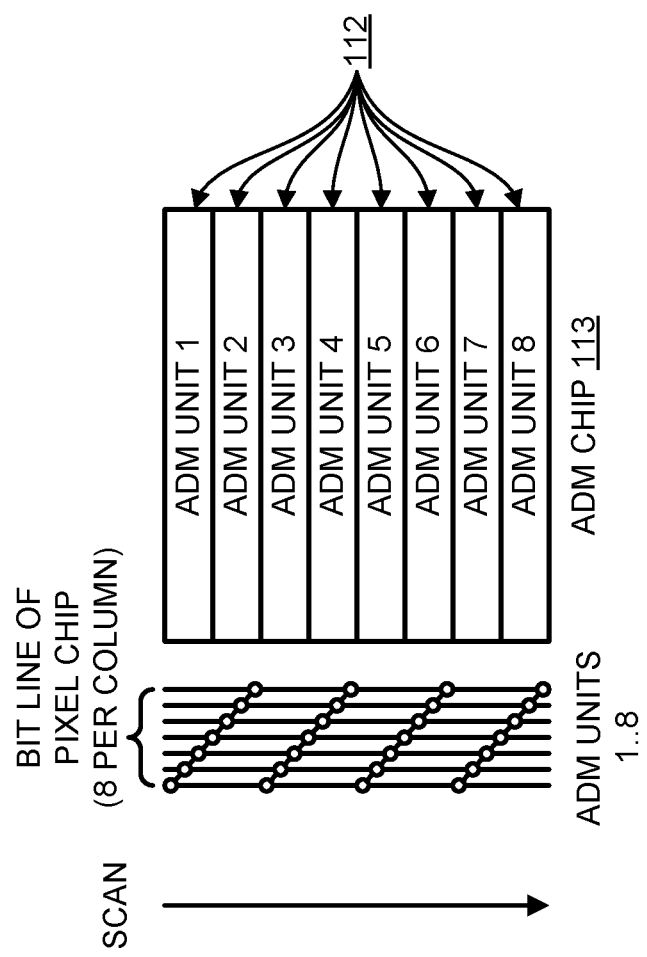

HIGH SPEED ROLLING IMAGE SENSOR WITH ADM ARCHITECTURE AND METHOD OF IMPLEMENTING THEREOF

FIELD

An example of the present invention relates generally to image sensors. More specifically, examples of the present invention are related to a high speed rolling image sensor using ADMs which are unit tiles that respectively include an analog-to-digital converter (ADC) and memory and methods of implementing the image sensor.

BACKGROUND

High speed image sensors have been widely used in many applications in different fields including the automotive field, the machine vision field, and the field of professional video photography. The technology used to manufacture image sensors, and in particular, complementary-metal-oxide-semiconductor (CMOS) image sensors, has continued to advance at great pace. For example, the demand of higher frame rates and lower power consumption has encouraged the further miniaturization and integration of these image sensors.

One way to increase the frame rate of a CMOS image sensor may be to increase the number of readout circuits operating in parallel. In conventional image sensors, one column of pixels in a pixel array may share one readout circuit. In other examples of the conventional art, one column of pixel cells in a pixel array may share a plurality of readout circuits. These solutions provide a higher frame rate, but require more silicon area, which is not be helpful in the miniaturization of silicon image sensors.

In order to miniaturize the image sensors, stacked chips were implemented where the pixel sensor layer is stacked on a circuit layer and sub-portions of the circuit layer process the image data for the pixels directly above it. While this enables high efficiency super high speed image sensors, these stacked chip implementations suffer from block noise at the boundary of each of the sub-portions of the circuit layer. As a result, a moving object's image captured using this stacked chip implementation is distorted at the boundary of the sub-portions of the circuit layer while the handshake between each of the sub-portions of the circuit layer during the image processing also causes distortions. Analog-to-digital conversion (ADC) variations may also be seen at the boundary between each of the sub-portions of the circuit layer. Further, given that the pixel signal lines are also separated at the boundary, the pixel output may also visibly vary at the boundary.

BRIEF DESCRIPTION OF THE DRAWINGS

The embodiments of the invention are illustrated by way of example and not by way of limitation in the figures of the accompanying drawings in which like references indicate similar elements throughout the various views unless otherwise specified. It should be noted that references to "an" or "one" embodiment of the invention in this disclosure are not necessarily to the same embodiment, and they mean at least one. In the drawings:

FIG. 4 is a diagram illustrating the details of connectors and ADM chip in the image sensor in FIG. 1 according to one embodiment of the invention.

Figure 1:
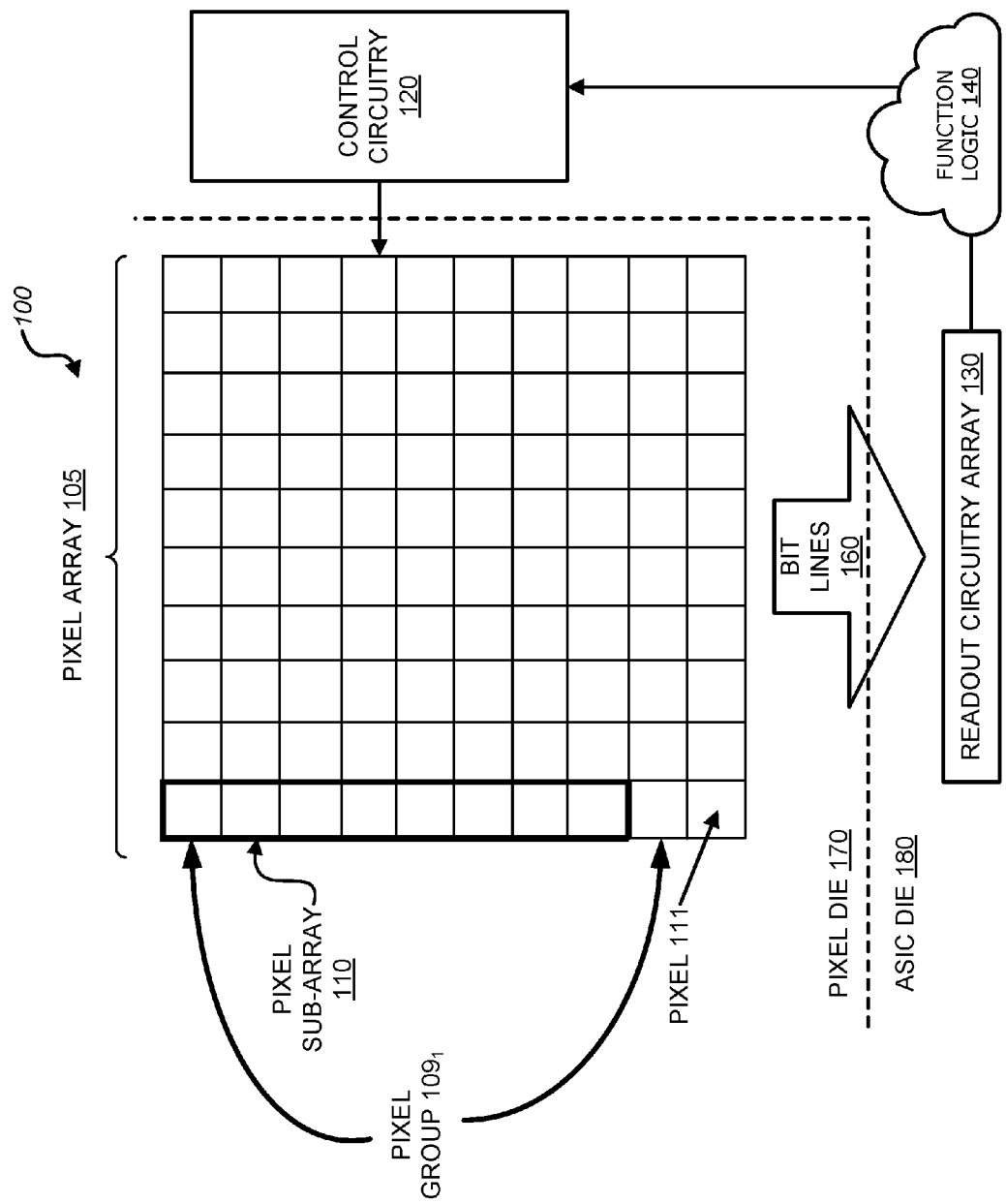
FIG. 1 is a block diagram illustrating an example imaging system that includes a high speed rolling image sensor having an ADM architecture in accordance to one embodiment of the invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. However, it is understood that embodiments of the invention may be practiced without these specific details. In other instances, well-known circuits, structures, and techniques have not been shown to avoid obscuring the understanding of this description.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Particular features, structures or characteristics may be included in an integrated circuit, an electronic circuit, a combinatorial logic circuit, or other suitable components that provide the described functionality.

As will be disclosed in various examples, an effective method to implement a high speed rolling CMOS image sensor is utilize ADM architecture in a readout circuitry of the image sensor. CMOS image sensor may also be arranged in a stacked CMOS chip solution in which pixel cells are included in a first semiconductor die and in which readout circuitry is included in a second semiconductor die. For instance, in one example, the first semiconductor die may be a pixel chip (or die), and the second semiconductor die may be an application specific integrated circuit (ASIC) chip (or die). In one example, the pixel array on the pixel chip may utilize pixel sub-arrays (PSAs) made up of pixels. In one example, pixel array on the pixel chip may also include a plurality of pixel groups and each pixel group includes a plurality of pixels that are non-contiguous, non-overlapping, and distinct. In one example, the amplifier output nodes of the pixel cells inside the pixel groups are coupled together such that each one of the pixel groups share a single analog-to-digital converter and memory unit tiles (ADMs) included in readout circuitry in accordance with the teachings of the present invention. In the example, the pixel sub-arrays are read out in parallel at high speed and/or with low power in accordance with the teachings of the present invention.

FIG. 1 is a block diagram illustrating an example imaging system that includes a high speed rolling image sensor having an ADM architecture in accordance to one embodiment of the invention.

As illustrated in FIG. 1, imaging system 100 includes an image sensor having a pixel array 105 comprising a plurality of pixels 111. Pixel array 105 may be partitioned into a plurality of pixel sub-arrays 110 including a pixel architecture in a stacked image sensor scheme in accordance with the teachings of the present invention. In the illustrated example, imaging system 100 is realized with stacked CMOS chips, which include a pixel die 170 stacked with and coupled to an ASIC die 108. In one example, pixel die 170 includes a pixel array 105, and ASIC die 180 includes control circuitry 120, readout circuitry array 130, and function logic 140. In the depicted example, readout circuitry array 130 comprises a plurality of readout circuitry 131 (seen in FIG. 3). In the depicted example, control circuitry 120 is coupled to control operation of pixel array 105, which is coupled to be read out by one of the plurality of readout circuitry 131 through bit lines 160. Bit lines 160 may be metal wires. In one example, an interconnect layer is disposed between pixel die 170 and ASIC die 180.

In one example, interconnect layer (not shown) may include a plurality of conductors and vias such as micro-through silicon vias (μTSVs) or through silicon vias (TSVs). Conductors may be bit lines 160. In example, the plurality of conductors may be utilized to couple readout circuitry 131 to the circuitry included in pixel die 170. In one embodiment, bit lines (or connectors) 160 pass through the pixel area of pixel array 105. Each pixel column in pixel array 105 includes may be coupled to readout circuitry 131 via a plurality of bit lines 160. In one embodiment, the number of bit lines per pixel column is greater than 2. As seen in FIG. 1, the number of bit lines per pixel column is 8 such that all the pixels 111 in pixel sub-array 110 may be readout in parallel, and every eight pixel (e.g. pixels 0, 8, 16, 24, . . . ) are coupled to the same bit line and analog-to-digital converter and memory unit tile (ADM), for example, pixels in pixel group $109_1$ may be coupled to the same bit line and ADM unit. Pixels 111 arranged in the same row would also be read out in parallel with its corresponding ADM units. As such, in this example, every eighth pixel may be read out in parallel by a corresponding readout circuit through a single one of the plurality of conductors, or single bit line, in accordance with the teachings of the present invention. In this example, pixel group $109_1$ includes every eight pixel (e.g., one pixel per pixel sub-array 110), which are non-contiguous, non-overlapping and distinct.

In the example depicted in FIG. 1, pixel array 105 is a two-dimensional (2D) array that is partitioned into a plurality of pixel sub-arrays 110 as shown. As shown in FIG. 1, pixel sub-arrays 110 include eight pixels, arranged in an 8×1 arrangement. In other examples, pixel sub-array 110 includes k pixels arranged in an n×m arrangement, where k is an integer greater than 2, and n and m are integer greater than or equal to 1.

Figure 2:
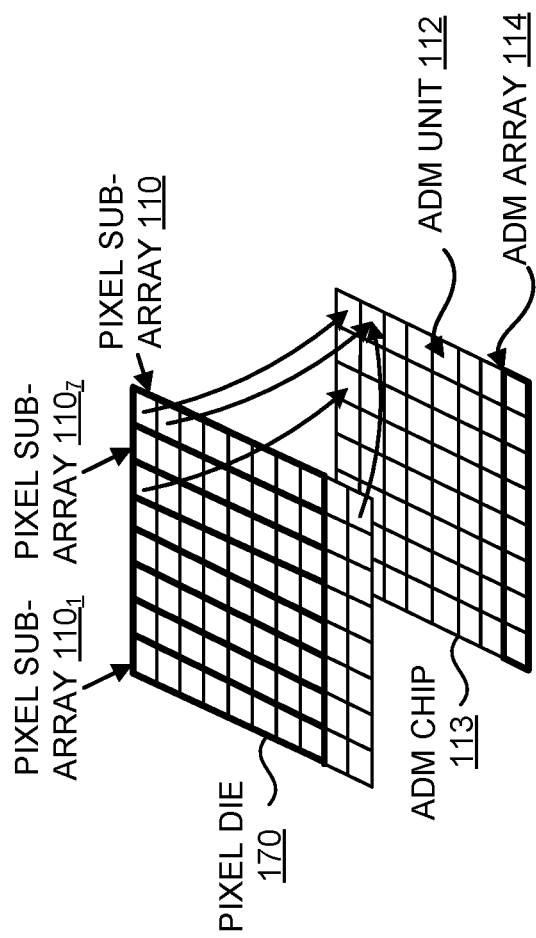
FIG. 2 illustrates the details of an image sensor in FIG. 1 including an example pixel array included on a pixel chip and an example ADM chip coupled thereto according to a first embodiment of the invention.

FIG. 2 illustrates the details of image sensor 100 in FIG. 1 including example pixel array 105 included on a pixel die 170 and an example ADM chip 113 coupled thereto according to a first embodiment of the invention. Pixel 111 of pixel sub-array 110 are each coupled to their own readout circuit, which may be included as one of a plurality of readout circuits included in readout circuitry 130 formed on an ASIC die 180 that is stacked with and coupled to pixel die 170. With a plurality of readout circuits, pixel sub-arrays arranged in the same row may be readout in parallel, decreasing the readout time of pixel array 105. In one embodiment, the single readout circuit includes an analog-to-digital converter and memory unit tile (ADM). Accordingly, the readout circuits included in readout circuitry array 130 respectively include ADMs.

As shown in FIG. 2, pixel sub-array 110 comprises eight pixels 111. In this example, each one of the plurality of pixel groups 109 in a pixel sub-array 110 is coupled to its own associated ADM unit 112 in an ADM chip 113. In one embodiment, pixel groups 109 includes a pixel 111 from each pixel sub-array 110 such that pixels 111 in a pixel group 109 are are non-contiguous, non-overlapping, and distinct. In this embodiment, every eighth pixel 111 in the same column is in the same pixel group 109. In the illustrated example, pixel sub-array 110 is arranged in 8×1 arrangement, so that every $8^{th}$ pixel in the same column share the same ADM unit 112, as seen in FIG. 2, the $2^{nd}$ and $9^{th}$ pixel of the illustrated column is readout by the same ADM unit 112. As shown in FIG. 2, ADM chip 113 includes a plurality of ADM units 112. As further described below in connection with FIG. 3, each ADM unit 112 may be included in one of a plurality of readout circuits 131 included in readout circuitry array 130. In some embodiments, ADM unit 112 may be separate from the readout circuitry 130 but included in ASIC die 180.

Figure 3:
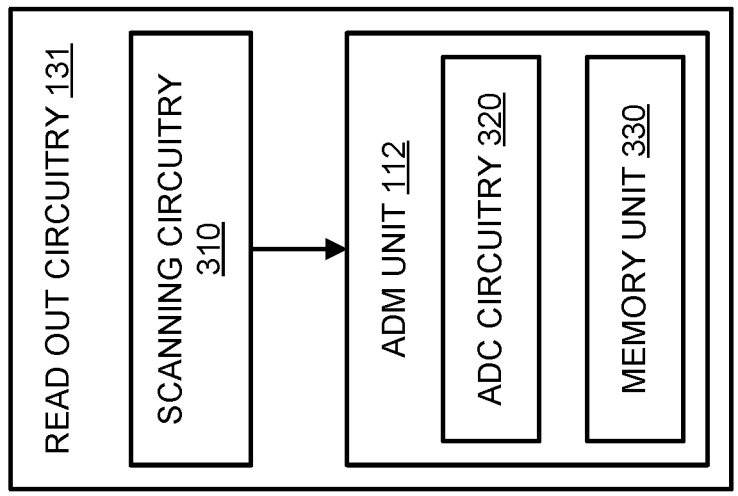
FIG. 3 is a block diagram illustrating the details of one of the plurality of readout circuits included in readout circuitry in FIG. 1 in accordance to one embodiment of the invention.

FIG. 3 is a block diagram illustrating the details of one of the plurality of readout circuits 131 included in readout circuitry array 130 in FIG. 1 in accordance to one embodiment of the invention. As shown in FIG. 3, readout circuitry 131 may include scanning circuit 310, and ADM unit 112, which is a unit tile that includes an analog-to-digital converter (ADC) circuitry 320 and memory unit 330. Scanning circuit 310 may also include amplification circuitry, selection circuitry (e.g., multiplexers), etc. to readout a row of image data at a time along readout bit lines 160 or may readout the image data using a variety of other techniques, such as a serial readout or a full parallel readout of all pixels simultaneously. In one embodiment, readout circuitry array 130 reads out image data from pixel array 105. Scanning circuit 310 acquires the image data. ADC circuitry 320 may convert each of the image data from scanning circuit 310 from analog to digital. For example, ADC circuitry 320 included in readout circuits, respectively, may convert the image data of an image frame from analog to digital to obtain an ADC output. In one example, each of the plurality of readout circuits 131 in readout circuitry array 130 may also include adders that are formed on ASIC die 180. Readout circuitry array 130 may readout pixel sub-arrays 110 arranged in the same row of pixel die 170. For example, as seen in FIG. 2, the eight pixels which comprises pixel sub-array 110 may be readout in parallel by their respective ADM unit 112, and at the same time, pixels 111 from pixel sub-array 110$_1$ thru 110$_7$ may be readout at the same time as pixel sub-array 110 is readout thru their respective ADM unit 112. Pixels 111 arranged in the same row may be coupled to ADM unit 112 arranged in the same ADM array 114. Pixels 111 which belong to the same pixel group may be readout by the same ADM unit 112.

Memory unit 330 that includes memory, such as static random access memory (SRAM) or dynamic random access memory (DRAM), may store ADC output from ADC circuitry 320. Referring back to FIG. 1, in one embodiment, function logic 140 processes ADC output to generate a final ADC output. In one embodiment, a logic circuitry (not shown) can control readout circuitry 130 and output image data to function logic 140. Function logic 140 may simply store the image data or even manipulate the image data by applying post image effects (e.g. crop, rotate, remove red eye, adjust brightness, adjust contrast, or otherwise).

In FIG. 1, control circuitry 120 is coupled to pixel array 105 to control the operational characteristics of pixel array 105. In one example, control circuitry 120 is coupled to generate a global shutter signal for controlling image acquisition for each pixel cell. In the example, the global shutter signal simultaneously enables particular pixel cells within all pixel sub-arrays 110 of pixel array 105 to simultaneously transfer the image charge from their respective photodetector during a single acquisition window.

In one example, after each of the pixel cells in a pixel sub-array 110 has acquired or captured its image data or image charge, the image data is read out by readout circuitry array 130 through a bit line of bit lines 160. In FIG. 4, the details of the bit lines (or connectors) and ADM chip 113 in image sensor 100 in FIG. 1 are illustrated in accordance to a first embodiment of the invention. As discussed above, bit lines 160 pass through the pixel area of pixel array 105. In other words, bit lines 160 are not separated at the ADM boundary. Each pixel column of pixel array 105 includes a number of bit lines 160. In one embodiment, the number of bit lines 160 coupled to each pixel column is greater than 2. In some embodiments, the number of bit lines 160 coupled to each pixel column is equal to the number of ADM units in readout circuitry 130. For instance in FIG. 4, the number of bit lines 160 is 8 to correspond to the eight ADM units 112 vertically arrayed in ADM chip 113. Neighboring pixels in pixel array 105 may thus be coupled periodically to different ADM units 112. In the example shown in FIG. 4, having 8 bit lines per pixel column results in every eighth pixel being coupled to the same bit line. For example, pixels 0, 8, 16, and 24 may be coupled to a first bit line (e.g., bit line 1) while pixels 1, 9, 17, and 25 may be coupled to a second bit line (e.g., bit line 2). As shown in FIG. 4, scanning circuitry 310 in readout circuitry 130 may perform a single continuous scan of pixel array 105.

By having a plurality of bit lines coupled to each pixel column in pixel array 105, pixel 111 included in pixel sub-array 110 and related ADM unit 112 are not placed at the same position on the chip (e.g., stacked image sensor 100) as shown in FIG. 2. The mapping between pixel groups 109 and memory unit 330 in ADM unit 112 is different since pixels 111 of the same pixel groups 109 and the corresponding ADM units 112 are not positioned above the corresponding readout circuits. In this embodiment, at ADC boundary, the block noise from prior art image sensors disappears.

Figure 5B:
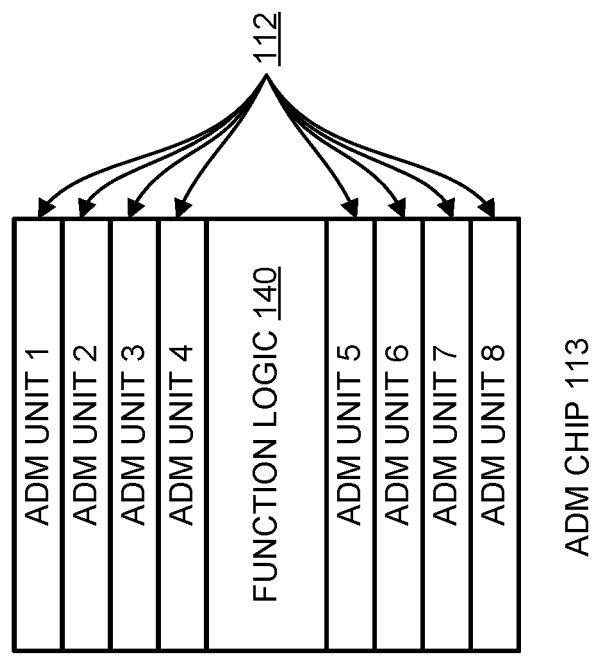
FIGS. 5A-5B illustrate the details of image sensor in FIG. 1 according to a second embodiment of the invention (FIG. 5A) and the details of ADM chip in image sensor in FIG. 1 according to the second embodiment of the invention (FIG. 5B).
Figure 5A:
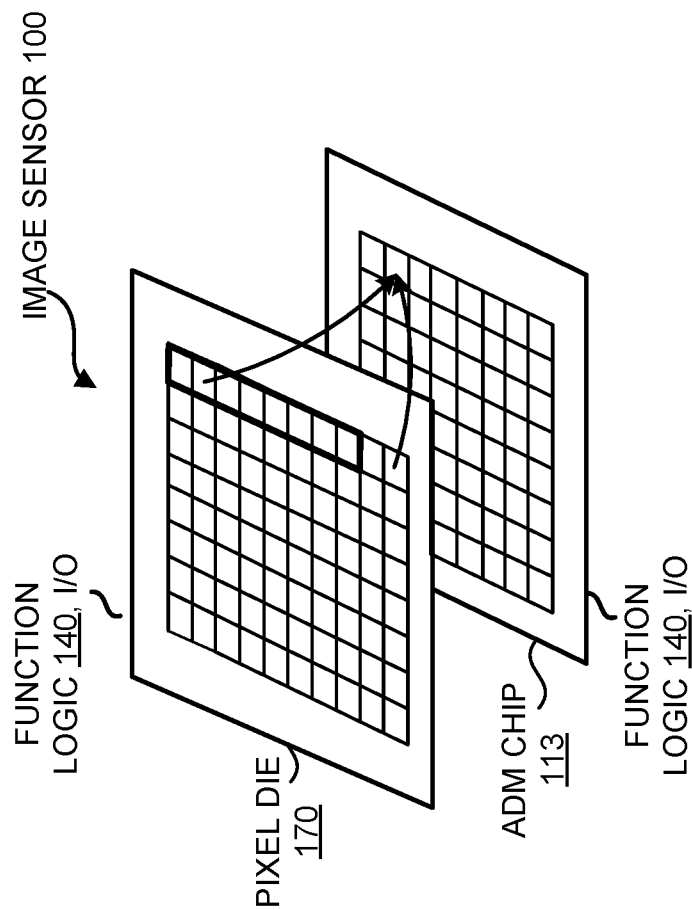
Figure 6:
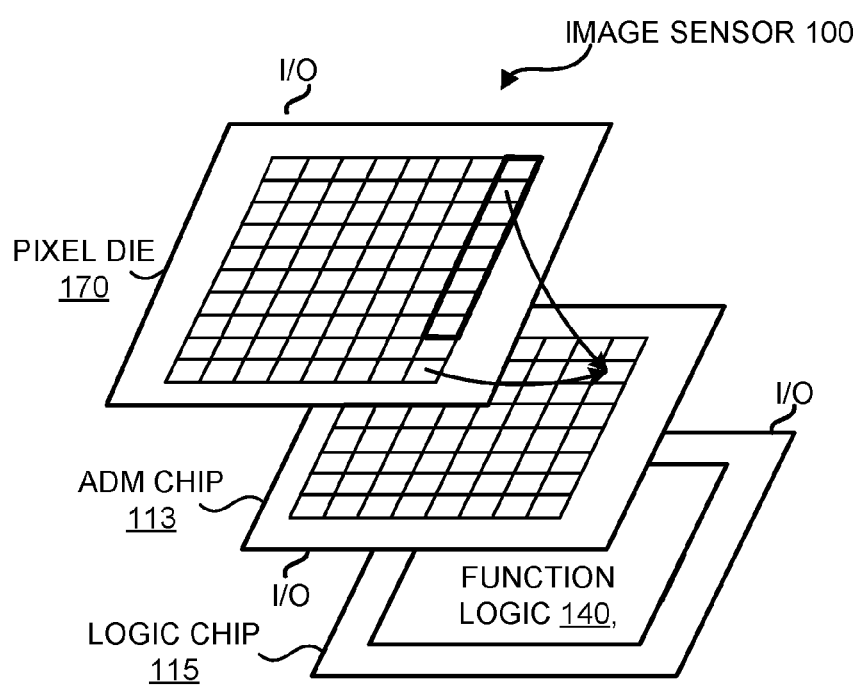
FIG. 6 illustrates the details of image sensor in FIG. 1 according to a third embodiment of the invention.

FIGS. 5A-5B illustrate the details of image sensor 100 in FIG. 1 according to a second embodiment of the invention (FIG. 5A) and the details of ADM chip 113 in image sensor 100 in FIG. 1 according to the second embodiment of the invention (FIG. 5B). In embodiment of image sensor 100 in FIG. 5A, function logic 140 or input/output or I/O may be included at the periphery of the pixel die 170 and ADM chip 113 coupled thereto. As shown in FIG. 5B, logic circuit may be included in the ADM chip 113 since ADC circuitry does not need to occupy all pixel area with having a plurality of bit lines 160 included in each pixel column. FIG. 6 illustrates the details of image sensor in FIG. 1 according to a third embodiment of the invention. In FIG. 6, image sensor 100 is a three-wafer stack wherein logic circuit is included on a logic chip 115 that is coupled to ADM chip 113 and pixel die 170.

Moreover, the following embodiments of the invention may be described as a process, which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a procedure, etc.

Figure 7:
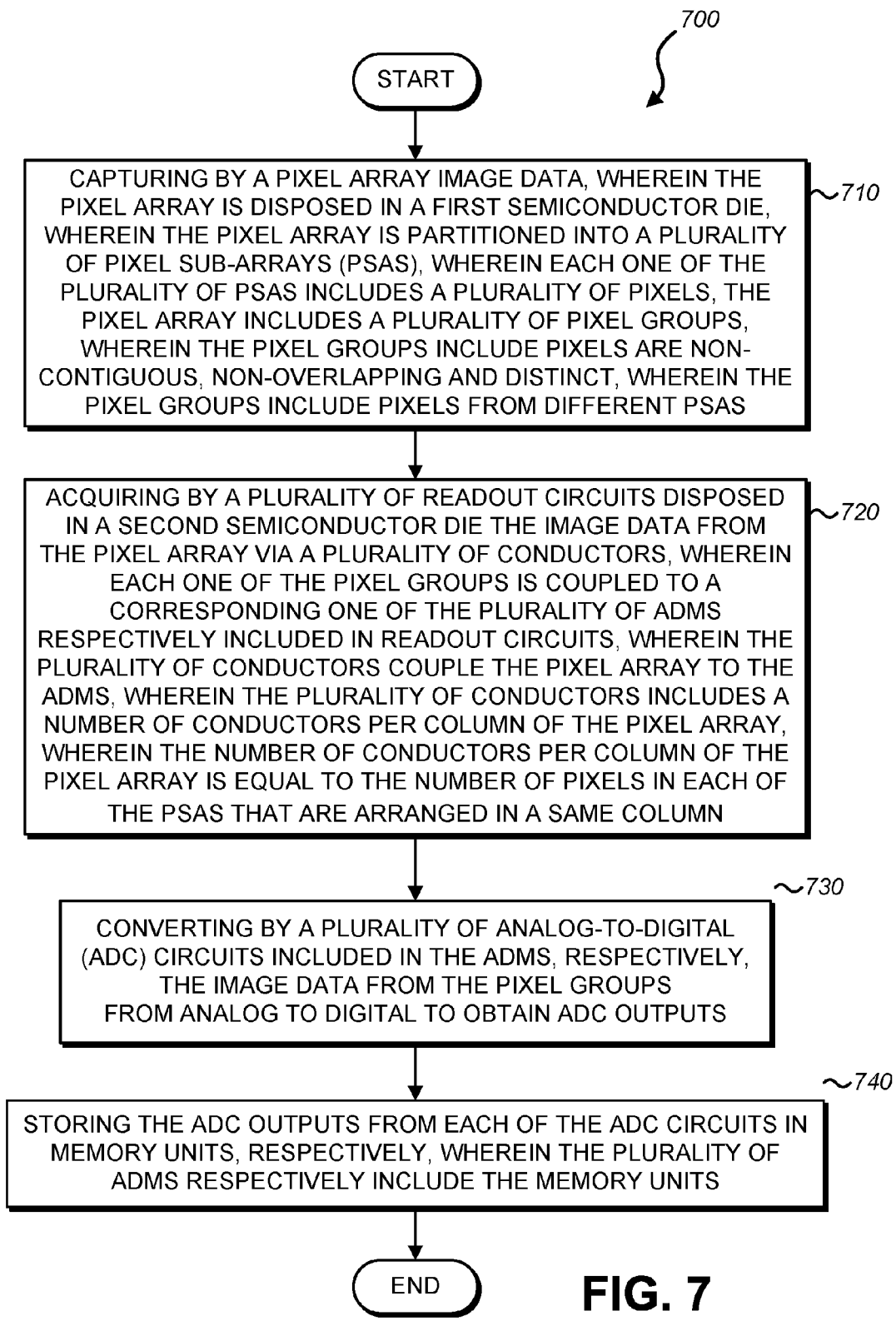
FIG. 7 is a flowchart showing an example process for implementing a high speed rolling image sensor in accordance to one embodiment of the invention.

FIG. 7 is a flowchart showing an example process for implementing a high speed rolling image sensor in accordance to one embodiment of the invention. Method 700 starts by capturing by a pixel array image data at Block 710. Pixel array may be disposed in a first semiconductor die. Pixel array is partitioned into a plurality of pixel sub-arrays (PSAs). Each one of the plurality of pixel sub-arrays includes a plurality of pixels. Pixel array may also include a plurality of pixel groups that include a plurality of pixels that are non-contiguous, non-overlapping and distinct. In one embodiment, pixels from different PSAs are included in the same pixel group. At Block 720, readout circuits disposed in a second semiconductor die acquire the image data from pixel array via a plurality of conductors. Each one of the pixel groups is coupled to a corresponding one of the plurality of analog-to-digital converter and memory unit tiles (ADMs) respectively included in readout circuits. A plurality of conductors may couple pixel array to readout circuits. In one embodiment, the plurality of conductors includes a number of conductors per column of pixel array. In one embodiment, the number of conductors per column of the pixel array is equal to the number of pixels in each one of the PSAs that is arranged in a same column. In one embodiment, the number of conductors per column of the pixel array is equal to the number of ADMs. At Block 730, a plurality of analog-to-digital (ADC) circuits included in the readout circuits, respectively, convert the image data from the pixel groups from analog to digital to obtain ADC outputs. At Block 740, ADC outputs from each of the ADC circuits are stored in memory units, respectively. In one embodiment, the plurality of ADMs respectively include the memory units. In one embodiment, the ADC circuits and the memory units are combined to form an ADM unit, which is a unit tile included in an ADM die.

Figure 8:
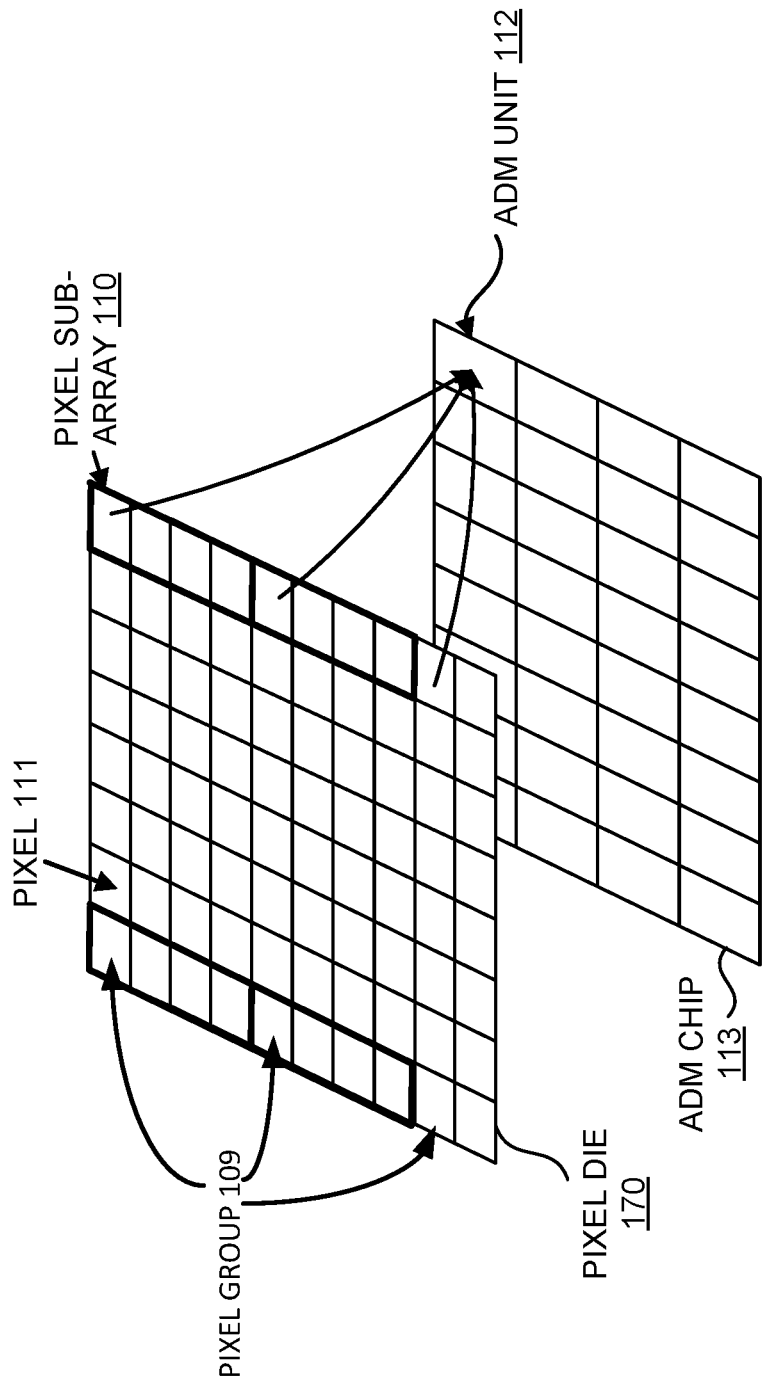
FIG. 8 illustrates the details of an image sensor in FIG. 1 including an example pixel array included on a pixel chip and an example ADM chip coupled thereto according to a second embodiment of the invention.

FIG. 8 illustrates the details of an image sensor in FIG. 1 including an example pixel array 105 included on a pixel chip 170 and an example ADM chip 113 coupled thereto according to a second embodiment of the invention. Pixel 111 of pixel sub-array 110 are each coupled to their own readout circuit, which may be included as one of a plurality of readout circuits included in readout circuitry 130 formed on an ASIC die 180 that is stacked with and coupled to pixel die 170. With a plurality of readout circuits, pixel sub-arrays arranged in the same row may be readout in parallel, decreasing the readout time of pixel array 105. In one embodiment, the single readout circuit includes an analog-to-digital converter and memory unit tile (ADM). According, the readout circuits included in readout circuitry 130 respectively include ADMs.

As shown in FIG. 8, pixel sub-array 110 comprises four pixels 111. In this example, each one of the plurality of pixels 111 in a pixel sub-array 110 is coupled to its own associated ADM unit 112 in an ADM chip 113. In the illustrated example, pixel sub-array 110 is arranged in a 4×1 arrangement, so that every $4^{th}$ pixel in the same column share the same ADM unit 112. As seen in FIG. 8, the $1^{st}$ and $5^{th}$ pixel of the illustrated column is readout by the same ADM unit 112. Pixels 111 belonging to the same pixel group 109 (e.g., every $4^{th}$ pixel in the same column) are read out by the same ADM unit 112. Pixels 111 belonging to the same pixel group 109 in FIG. 8 are non-contiguous, non-overlapping, and distinct. As shown in FIG. 8, ADM chip 113 includes a plurality of ADM units 112. As previously described in connection with FIG. 3, each ADM unit 112 may be included in one of a plurality of readout circuits 131 included in readout circuitry array 130. In some embodiments, ADM unit 112 may be separate from the readout circuitry 130 but included in ASIC die 180. Readout circuitry array 130 may readout pixel sub-arrays 110 arranged in the same row of pixel die 170. For example, as seen in FIG. 8, the four pixels which comprises pixel sub-array 110 may be readout in parallel by their respective ADM unit 112, and pixels 111 from other pixel sub-arrays 110 may be readout at the same time as pixel sub-array 110 is readout through their respective ADM unit 112. Pixels 111 included in the same pixel group 109 may be readout by the same ADM unit 112.

In the second embodiment of the invention, as seen in FIG. 8, the number of bit lines 160 coupled to each pixel column of pixel array 105 is four, which corresponds to the four ADM units 112 vertically arrayed in ADM chip 113. Neighboring pixels in pixel array 105 may thus be coupled periodically to different ADM units 112. In the example shown in FIG. 8, having 4 bit lines per pixel sub-array 110 results in every fourth pixel being coupled to the same bit line. In this example, the number of conductors per column of pixel array 105 corresponds to the number of pixels 111 in pixel sub-array 110 that are arranged in a same column (e.g., m=2).

Figure 9:
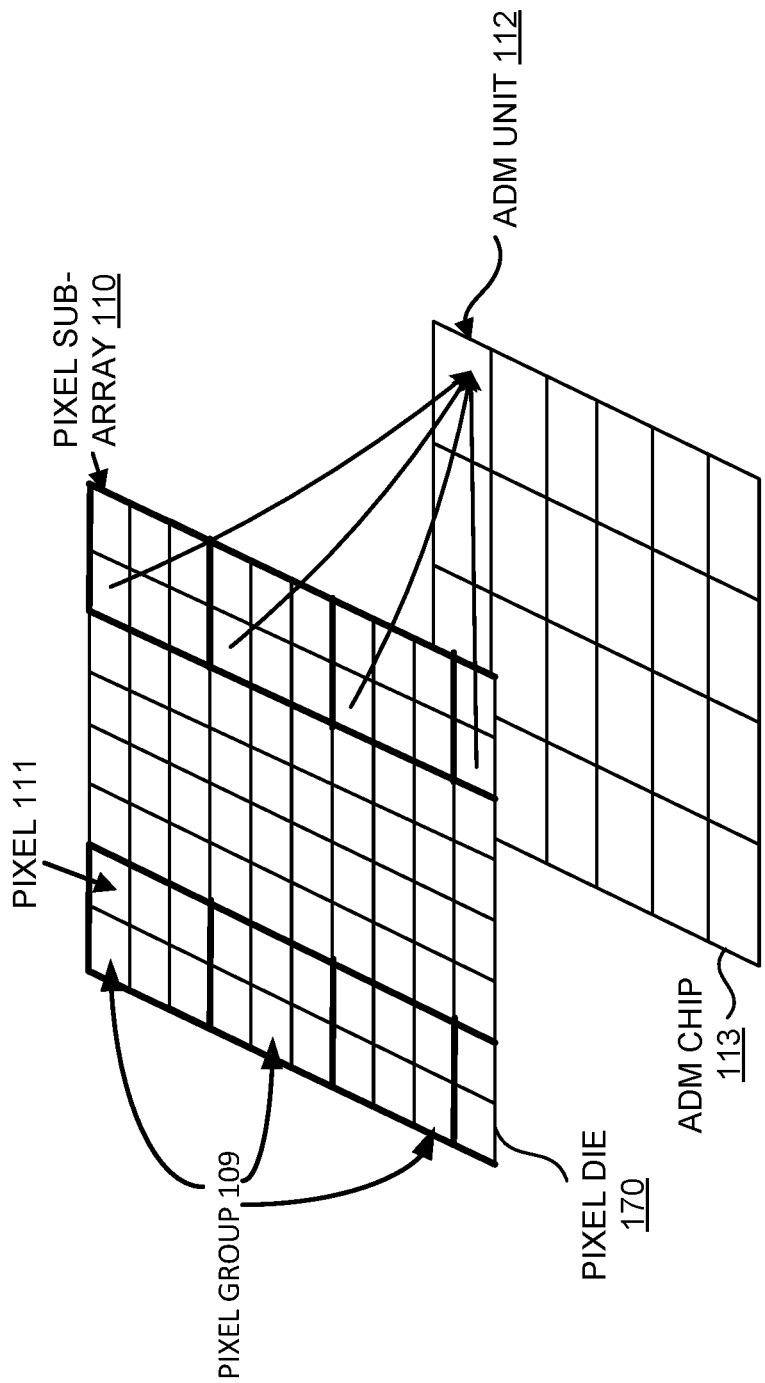
FIG. 9 illustrates the details of an image sensor in FIG. 1 including an example pixel array included on a pixel chip and an example ADM chip coupled thereto according to a third embodiment of the invention.

FIG. 9 illustrates the details of an image sensor in FIG. 1 including an example of pixel array 105 included on a pixel chip 170 and an example ADM chip 113 coupled thereto according to a third embodiment of the invention. In this embodiment of the invention, each pixel sub-array 110 comprises six pixels 111. Each of the plurality of pixels 111 in pixel sub-array 110 is coupled to its own associated ADM unit in ADM chip 113. In the illustrated example, pixel sub-array 110 is arranged in a 2×3 arrangement so that every $3^{rd}$ pixel in the same column shares the same ADM unit 112, as seen in FIG. 9. Pixels 111 belonging to the same pixel group 109 are read out by the same ADM unit 112. Pixels 111 belonging to the same pixel group 109 (e.g., every $3^{rd}$ pixel in the same column) are non-contiguous, non-overlapping, and distinct.

As shown in FIG. 9, ADM chip 113 includes a plurality of ADM units 112. As previously described in connection with FIG. 3, each ADM unit 112 may be included in one of a plurality of readout circuits 131 included in readout circuitry array 130. In some embodiments, ADM unit 112 may be separate from the readout circuitry 130 but included in ASIC die 180. Readout circuitry array 130 may readout pixel sub-arrays 110 arranged in the same row of pixel die 170. For example, as seen in FIG. 9, the pixels 111 in pixel sub-array 110 that are arranged in the same row may be readout in parallel by their respective ADM unit 112, and pixels 111 from other pixel sub-arrays 110 that are arranged in the same row may also be readout at the same time as pixel sub-array 110 is readout thru their respective ADM unit 112. Pixels 111 included in the same pixel group 109 may be readout by the same ADM unit 112. As shown in FIG. 9, ADM chip 113 includes a plurality of ADM columns including ADM units 112. Each ADM column includes a number of ADM units 112 that is equal to the number of pixels 111 included in each pixel sub-array 110. In this embodiment, each ADM column includes 6 ADM units 112. In this embodiment, the number of conductors per column of pixel array 105 corresponds to the number of pixels 111 in pixel sub-array 110 that are arranged in a same column (e.g., m=3). In this embodiment, the number of conductors coupled to the 2×3 pixel sub-array is 6 and the number of conductors per column of pixel array 105 is 3.

It is understood that pixel sub-arrays 110 may be configured in any n column×m row cell formation. In one embodiment, at least one of n or m is an integer greater than 1. In one embodiment, n and m are integers greater than 1. In one embodiment, the number of pixels 111 included in the pixel sub-array corresponds to the number of ADM units 112. In this embodiment, each pixel groups 109 include one pixel 111 from each pixel sub-array 110 such that the number of pixel groups 109 is equal to the number of pixels 111 in each pixel sub-array 110. Each pixel group 109 is coupled to a corresponding ADM unit 112. In one embodiment, the number of bit lines per column is equal to the number of pixels 111 in a pixel sub-array 110 that is arranged in a same column (e.g., m pixels). For example, in one embodiment where the pixel sub-array 110 is 4×3 arrangement, there would be 12 connectors coupled to pixel sub-array 110 and 3 connectors (or bit lines) (e.g., 3 pixels 111 in pixel sub-array in the same column) per column of pixel array 105. In the embodiment, where n is equal to 1, the number of bit lines per column is equal to the number of ADM units 112, which is equal to the number of pixels 111 in pixel sub-array 110.

The processes explained above are described in terms of computer software and hardware. The techniques described may constitute machine-executable instructions embodied within a machine (e.g., computer) readable storage medium, that when executed by a machine will cause the machine to perform the operations described. Additionally, the processes may be embodied within hardware, such as an application specific integrated circuit ("ASIC") or the like.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An image sensor comprising:
a pixel array disposed in a first semiconductor die, wherein the pixel array is partitioned into a plurality of pixel sub-arrays (PSAs), wherein each one of the plurality of PSAs includes a plurality of pixels, wherein the pixel array includes a plurality of pixel groups that include pixels that are non-contiguous, wherein each pixel group includes pixels from different PSAs;
a plurality of readout circuits disposed in a second semiconductor die, wherein the plurality of readout circuits respectively include analog-to-digital converter and memory unit tiles (ADMs), wherein each one of the pixel groups is coupled to a corresponding one of the plurality of ADMs, the ADMs respectively include (i) analog-to-digital (ADC) circuits that convert the image data from the pixel groups from analog to digital to obtain ADC outputs, and (ii) memory units to store the ADC outputs; and
a plurality of conductors coupling the pixel array to the plurality of ADMs, wherein the plurality of conductors includes a number of conductors per column of the pixel array,
wherein the number of conductors per column of the pixel array is equal to the number of pixels in the PSA that are arranged in a same column.

2. The image sensor of claim 1, wherein the number of conductors is greater than or equal to four conductors.

3. The image sensor of claim 2, wherein the number of conductors is eight, wherein each eight pixel in the pixel array is coupled to a same one of the eight conductors.

4. The image sensor of claim 1, wherein the image sensor is a stacked image sensor, and wherein the pixel groups are not positioned directly above the corresponding ADMs.

5. An image sensor comprising:
a pixel array disposed in a first semiconductor die, wherein the pixel array is partitioned into a plurality of pixel sub-arrays (PSAs), wherein each one of the plurality of PSAs includes a plurality of pixels, wherein the pixel array includes a plurality of pixel groups that include pixels that are non-contiguous, non-overlapping and distinct, wherein each pixel group includes pixels from different PSAs;
a plurality of readout circuits disposed in a second semiconductor die, wherein the plurality of readout circuits respectively include analog-to-digital converter and memory unit tiles (ADMs), wherein each one of the pixel groups is coupled to a corresponding one of the plurality of ADMs, the ADMs respectively include (i) analog-to-digital (ADC) circuits that convert the image data from the pixel groups from analog to digital to obtain ADC outputs, and (ii) memory units to store the ADC outputs; and
a plurality of conductors coupling the pixel array to the plurality of ADMs, wherein the plurality of conductors includes a number of conductors per column of the pixel array, wherein the number of conductors per column of the pixel array is equal to the number of pixels in the PSA that are arranged in a same column.

6. The image sensor of claim 5, wherein the plurality of readout circuits respectively include logic circuits to process the ADC outputs from the ADCs to generate final ADC outputs, wherein the memory units store the final ADC outputs.

7. The image sensor of claim 5, further comprising: logic circuits disposed in a third semiconductor die coupled to the readout circuits to receive and process the ADC outputs from the ADCs to generate final ADC outputs.

8. The image sensor of claim 5, wherein the number of conductors is greater than or equal to four conductors.

9. The image sensor of claim 8, wherein the number of conductors is eight, wherein each eight pixel in the pixel array is coupled to a same one of the eight conductors.

10. The image sensor of claim 5, wherein the pixel groups and the corresponding ADMs, respectively, are positioned at different locations on the first semiconductor die and the second semiconductor die.

11. The image sensor of claim 10, wherein the pixel groups are not positioned directly above the corresponding ADMs.

12. A method of implementing a high speed rolling image sensor comprising:
capturing by a pixel array image data, wherein the pixel array is disposed in a first semiconductor die, wherein the pixel array is partitioned into a plurality of pixel sub-arrays (PSAs), where the pixel array includes a plurality of pixel groups, wherein each one of the plurality of pixel groups includes a plurality of pixels that are non-contiguous, non-overlapping and distinct, wherein each pixel group includes pixels from different PSAs;
acquiring by a plurality of readout circuits disposed in a second semiconductor die the image data from the pixel array via a plurality of conductors, wherein each one of the pixel groups is coupled to a corresponding one of the plurality of analog-to-digital converter and memory unit tiles (ADMs) respectively included in readout circuits,
wherein the plurality of conductors couple the pixel array to the plurality of ADMs, wherein the plurality of conductors includes a number of conductors per column of the pixel array, wherein the number of conductors per column of the pixel array is equal to the number of pixels in the PSA that are arranged in a same column,
converting by a plurality of analog-to-digital (ADC) circuits included in the ADMs, respectively, the image data from the pixel groups from analog to digital to obtain ADC outputs; and
storing the ADC outputs from each of the ADC circuits in memory units, respectively, wherein the plurality of ADMs respectively include the memory units.

13. The method of claim 12, further comprising:
processing by logic circuits the ADC outputs from the ADCs to generate final ADC outputs, wherein the memory units store the final ADC outputs.

14. The method of claim 13, wherein the logic circuits are included in the readout circuits, respectively.

15. The method of claim 14, wherein the logic circuits are disposed in a third semiconductor die coupled to the readout circuits to receive and process the ADC outputs from the ADCs to generate final ADC outputs.

16. The method of claim 12, wherein the number of conductors is greater than or equal to four conductors.

17. The method of claim 16, wherein the number of conductors is eight, wherein each eight pixel in the pixel array is coupled to a same one of the eight conductors.

18. The method of claim 12, wherein the pixel groups and the corresponding ADMs, respectively, are positioned at different locations on the first semiconductor die and the second semiconductor die.

19. The method of claim 18, wherein the pixel groups are not positioned above the corresponding ADMs.

* * * * *